United States Patent
Bae et al.

(10) Patent No.: US 10,453,903 B2
(45) Date of Patent: Oct. 22, 2019

(54) COLOR MIRROR SUBSTRATE, METHOD OF MANUFACTURING THE SAME AND COLOR MIRROR DISPLAY DEVICE HAVING THE SAME

(71) Applicant: SAMSUNG DISPLAY CO., LTD., Yongin-si, Gyeonggi-Do (KR)

(72) Inventors: Jong-Sung Bae, Hwaseong-si (KR); Mu-Gyeom Kim, Hwaseong-si (KR); Young Seok Kim, Seoul (KR); Yun-Mo Chung, Yongin-si (KR)

(73) Assignee: Samsung Display Co., Ltd. (KR)

( * ) Notice: Subject to any disclaimer, the term of this patent is extended or adjusted under 35 U.S.C. 154(b) by 54 days.

(21) Appl. No.: 15/231,464

(22) Filed: Aug. 8, 2016

(65) Prior Publication Data

US 2017/0045651 A1   Feb. 16, 2017

(30) Foreign Application Priority Data

Aug. 13, 2015  (KR) .................. 10-2015-0114894

(51) Int. Cl.
| | |
|---|---|
| *G02B 5/08* | (2006.01) |
| *H01L 27/32* | (2006.01) |
| *G02F 1/1335* | (2006.01) |
| *B82Y 30/00* | (2011.01) |
| *B82Y 20/00* | (2011.01) |

(52) U.S. Cl.
CPC ............ *H01L 27/322* (2013.01); *B82Y 30/00* (2013.01); *G02B 5/085* (2013.01); *G02F 1/133553* (2013.01); *B82Y 20/00* (2013.01); *G02F 2001/133562* (2013.01); *G02F 2202/36* (2013.01); *H01L 27/3225* (2013.01); *Y10S 977/774* (2013.01); *Y10S 977/824* (2013.01); *Y10S 977/952* (2013.01)

(58) Field of Classification Search
CPC ..... G02B 5/08; H01L 51/5271; H01L 27/322; H01L 27/32; Y10S 977/774; G02F 1/133553; G02F 1/133617; G02F 1/133345; B82Y 20/00
USPC ........................................................ 359/884
See application file for complete search history.

(56) References Cited

U.S. PATENT DOCUMENTS

| | | | | |
|---|---|---|---|---|
| 6,958,796 | B2 * | 10/2005 | Takizawa | G02F 1/133553 349/106 |
| 8,933,625 | B2 * | 1/2015 | Chung | H01L 51/5271 313/504 |
| 2014/0036532 | A1 * | 2/2014 | Lee | G02B 6/0021 362/608 |
| 2014/0084247 | A1 * | 3/2014 | Zhang | H01L 29/775 257/24 |

* cited by examiner

*Primary Examiner* — Euncha P Cherry
(74) *Attorney, Agent, or Firm* — Innovation Counsel LLP

(57) ABSTRACT

A color mirror substrate may include a transparent substrate, a plurality of wavelength conversion patterns arranged on the transparent substrate, and a plurality of mirror patterns, ones of the mirror patterns stacked on respective ones of the wavelength conversion patterns. Each wavelength conversion pattern may include a wavelength conversion particle with a quantum dot. In the color mirror display device, a mirror property having a desired color may be implemented. For example, a gold mirror or a black mirror may be implemented by using various types of quantum dots.

15 Claims, 12 Drawing Sheets

COLOR MIRROR SUBSTRATE, METHOD OF MANUFACTURING THE SAME AND COLOR MIRROR DISPLAY DEVICE HAVING THE SAME

CROSS-REFERENCE TO RELATED APPLICATION

This application claims priority under 35 USC § 119 to Korean Patent Application No. 10-2015-0114894 filed on Aug. 13, 2015 in the Korean Intellectual Property Office (KIPO), the contents of which are herein incorporated by reference in their entirety.

BACKGROUND

1. Field

Example embodiments relate to color mirror substrates. More particularly, example embodiments relate to color mirror substrates having a plurality of mirror patterns, methods of manufacturing the same and color mirror display devices including the same.

2. Description of the Related Art

Recent research efforts have focused on a display device, e.g., an organic light emitting display (OLED) device or a liquid crystal display (LCD) device, having a mirror or reflective property together with an image display property.

In particular, research efforts have focused on display devices having a color mirror property. However, such display devices have been found to exhibit certain drawbacks, such as failure to display desired colors and reductions in display quality due to an implementation of the color mirror property.

SUMMARY

Example embodiments provide a color mirror substrate having improved display quality.

Example embodiments provide a method of manufacturing the color mirror substrate.

Example embodiments provide a color mirror display device including the color mirror substrate.

According to example embodiments, there is provided a color mirror substrate. The color mirror substrate may include a transparent substrate, a plurality of wavelength conversion patterns arranged on the transparent substrate, and a plurality of mirror patterns. Ones of the mirror patterns may be stacked on respective ones of the wavelength conversion patterns. Each wavelength conversion pattern may include a wavelength conversion particle.

In example embodiments, the wavelength conversion particle may include a quantum dot. The quantum dot may include a core, a shell enclosing the core and a ligand formed on a surface of the shell.

In example embodiments, the wavelength conversion patterns may be disposed between the transparent substrate and the mirror patterns.

In example embodiments, the wavelength conversion patterns may be arranged on a first surface of the transparent substrate. The mirror patterns may be arranged on a second surface of the transparent substrate, the second surface being opposite to the first surface.

In example embodiments, the color mirror substrate may further include a plurality of electron transport patterns interposed between the wavelength conversion patterns and the mirror patterns.

According to example embodiments, there is provided a method of manufacturing a color mirror substrate. In the method, a transparent substrate may be provided. A plurality of wavelength conversion patterns may be formed on the transparent substrate. A plurality of mirror patterns may be formed, ones of the mirror patterns respectively formed on ones of the wavelength conversion patterns.

In example embodiments, in formation of the wavelength conversion patterns, a transparent polymer layer including a wavelength conversion particle may be formed on the transparent substrate. The transparent polymer layer may be patterned.

In example embodiments, the wavelength conversion particle may include a quantum dot.

In example embodiments, in formation of the mirror patterns, a plurality of electron transport patterns may be formed on the wavelength conversion patterns. The mirror patterns may be formed on the electron transport patterns by performing a metal self-patterning process.

According to example embodiments, there is provided a color mirror display device. The color mirror display device may include a display unit on a first substrate and a color mirror substrate on the first substrate and the display unit. The color mirror substrate may include a plurality of wavelength conversion patterns arranged at a second substrate, and a plurality of mirror patterns, ones of the mirror overlapping under respective ones of the wavelength conversion patterns. Each wavelength conversion pattern may include a wavelength conversion particle.

In example embodiments, the wavelength conversion particle may include a quantum dot. The quantum dot may include a core, a shell enclosing the core and a ligand formed on a surface of the shell.

In example embodiments, the core may include at least one cation and at least one anion. The cation may be selected from the group consisting of an element in Group XII and an element in Group XIII. The anion may be selected from the group consisting of an element in Group XV and an element in Group XVI.

In example embodiments, the shell may include at least one cation and at least one anion. The cation may be an element in Group XII. The anion may be an element in Group XVI.

In example embodiments, the ligand may include oleate or trioctylphosphine.

In example embodiments, the core may include at least one element which is selected from the group consisting of an element in Group X and an element in Group XI.

In example embodiments, the core may include gold, silver, or platinum.

In example embodiments, the shell may include silicon oxide.

In example embodiments, the display unit may include an emissive region and a non-emissive region. The emissive region may overlap a portion of the second substrate between neighboring ones of the wavelength conversion patterns. The non-emissive region may overlap a stacked structure including the wavelength conversion patterns and the mirror patterns.

In example embodiments, the emissive region may include an organic emitting layer or a liquid crystal layer.

In example embodiments, the wavelength conversion patterns may be arranged under the second substrate. The mirror patterns may be stacked under the wavelength conversion patterns.

In example embodiments, the color mirror display device may further include a plurality of electron transport patterns (ETPs) interposed between the wavelength conversion patterns and the mirror patterns.

In example embodiments, the second substrate may include a thin film encapsulation layer. The wavelength conversion patterns may be arranged on the second substrate. The mirror patterns may be stacked on the wavelength conversion patterns.

In example embodiments, the color mirror display device may further include an insulation layer disposed on the second substrate on which the wavelength conversion patterns and the mirror patterns are stacked.

In example embodiments, the second substrate may include a first thin film encapsulation layer and a second thin film encapsulation layer. The wavelength conversion patterns may be arranged on the first thin film encapsulation layer. The mirror patterns may be stacked on the wavelength conversion patterns. The second thin film encapsulation layer may be disposed on the first thin film encapsulation layer on which the wavelength conversion patterns and the mirror patterns are stacked.

According to embodiments of the present invention, a color mirror substrate may include wavelength conversion patterns including a quantum dot. In the color mirror display device, a mirror property having a desired color may be implemented.

For example, a gold mirror or a black mirror may be implemented by using various types of quantum dots.

In particular, in the color mirror substrate in accordance with example embodiments, the wavelength conversion patterns may be disposed at various positions so that a display quality of the color mirror display device may be enhanced.

BRIEF DESCRIPTION OF THE DRAWINGS

Example embodiments will be more clearly understood from the following detailed description taken in conjunction with the accompanying drawings.

FIG. 1 is a cross-sectional view illustrating a color mirror substrate in accordance with example embodiments.

FIG. 2 is a cross-sectional view illustrating a quantum dot of FIG. 1.

FIGS. 3 to 5 are cross-sectional views illustrating a method of manufacturing a color mirror substrate in accordance with example embodiments.

FIG. 6 is a cross-sectional view illustrating a color mirror substrate in accordance with example embodiments.

FIGS. 7 and 8 are cross-sectional views illustrating a method of manufacturing a color mirror substrate in accordance with example embodiments.

FIG. 9 is a cross-sectional view illustrating a color mirror substrate in accordance with example embodiments.

FIG. 10 is a cross-sectional view illustrating a color mirror substrate in accordance with example embodiments.

FIG. 11 is a cross-sectional view illustrating a color mirror display device in accordance with example embodiments.

FIG. 12 is an enlarged view of a region A of FIG. 11.

FIG. 13 is a cross-sectional view illustrating a color mirror display device in accordance with example embodiments.

FIG. 14 is a cross-sectional view illustrating a color mirror display device in accordance with example embodiments.

FIG. 15 is a cross-sectional view illustrating a color mirror display device in accordance with example embodiments.

DETAILED DESCRIPTION OF THE EMBODIMENTS

Figure 1:
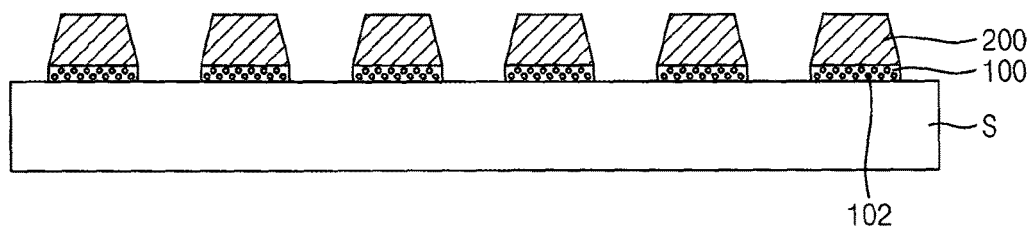
FIGS. 1 to 15 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. The various Figures are thus not to scale. Like numerals refer to like elements throughout. All numerical values are approximate, and may vary. All examples of specific materials and compositions are to be taken as nonlimiting and exemplary only. Other suitable materials and compositions may be used instead.

Figure 2:
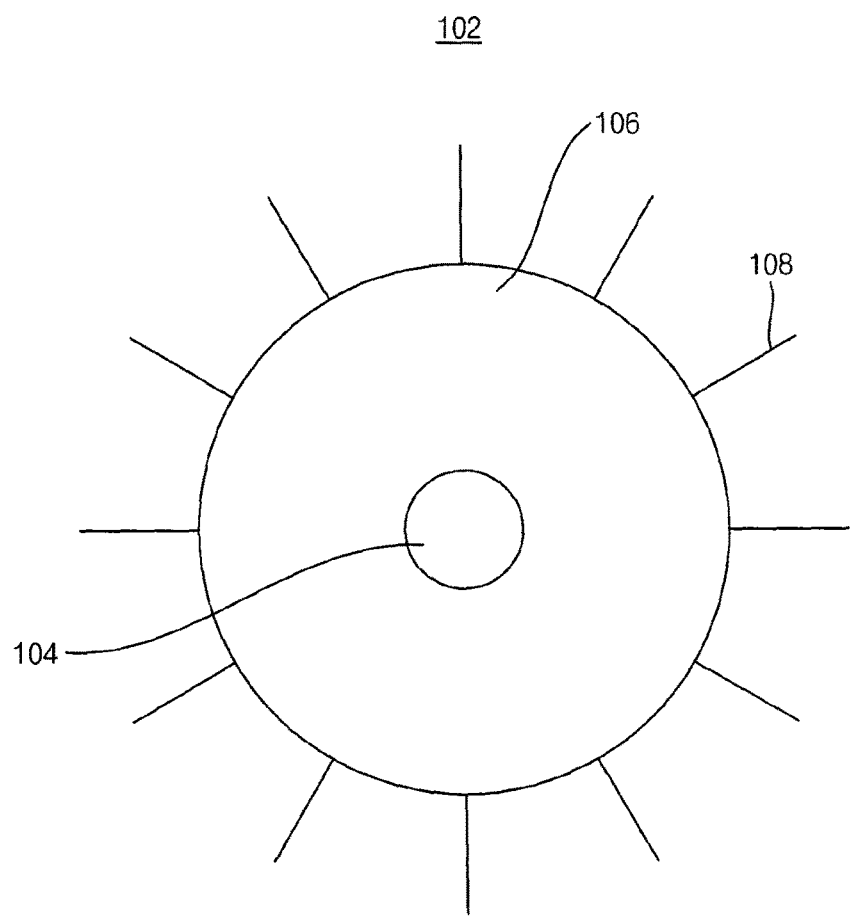

FIG. 1 is a cross-sectional view illustrating a color mirror substrate in accordance with example embodiments. FIG. 2 is a cross-sectional view illustrating a quantum dot of FIG. 1.

Referring to FIGS. 1 and 2, the color mirror substrate may include a plurality of wavelength conversion patterns 100 arranged on a transparent substrate S, and a plurality of mirror patterns 200 stacked on the wavelength conversion patterns 100. Each wavelength conversion pattern 100 may include one or more wavelength conversion particles 102.

The transparent substrate S may include, e.g., a glass substrate or a transparent plastic substrate. The transparent substrate S may include a region which overlaps pixel regions of a display device, e.g., when the color mirror substrate is provided as an encapsulation substrate of the display device.

The transparent substrate S may include a region which overlaps a peripheral region surrounding the pixel regions and including a driving circuit (e.g. a scan driver, an emission control driver, etc.) of the display device.

The wavelength conversion patterns 100 may be arranged on the transparent substrate S to have various shapes. For example, the wavelength conversion patterns 100 may be arranged in, e.g., a grid shape, a line shape, a mesh shape, or as a plurality of islands. Indeed, any shapes are contemplated.

The mirror patterns 200 may be arranged on the wavelength conversion patterns 100, respectively. For example, a shape of the mirror patterns 200 may be substantially the same as the shape of the wavelength conversion patterns 100.

The mirror pattern 200 may include a material having a high reflectivity. In example embodiments, the mirror pattern 200 may include a metal such as aluminum (Al), chromium (Cr), copper (Cu), silver (Ag), titanium (Ti), tantalum (Ta), molybdenum (Mo), tungsten (W), etc. The mirror pattern 200 may have a single metal layered structure. Alternatively, in some embodiments, the mirror pattern 200 may have, e.g., a double-layer structure or a triple-layer structure which includes a plurality of different metal layers.

When the color mirror substrate serves as the encapsulation substrate of the display device, the mirror pattern 200 may overlap a non-emitting region but not an emitting region of the display.

In this case, a portion of the transparent substrate S between neighboring mirror patterns 200 of the color mirror substrate may overlap the emitting region of the display device.

Each wave conversion pattern 100 may include one or more wavelength conversion particles 102. For example, the wavelength conversion particle 102 may include a quantum dot. The quantum dot may include a core 104, a shell 106 enclosing the core 104, and a ligand 108 formed on a surface of the shell 106.

The core 104 may be located at a center of the quantum dot and may have a substantially spherical shape. The core 104 may include at least one cation and at least one anion.

The cation may include an element in Group XII and/or an element in Group XIII. For example, the cation of the core 104 may include cadmium (Cd), zinc (Zn) and/or indium (In).

The anion of the core 104 may include an element in Group XV and/or an element in Group XVI. For example, the anion may include sulfur (S), selenium (Se), tellurium (Te) and/or phosphorous (P).

In example embodiments, the core 104 may be a binary core including, e.g., CdSe, CdTe, CdS, ZnSe, ZnTe, InP, etc., a ternary core including, e.g., ZnCdS, ZnSeTe, CdSeS, ZnCdSe, ZnCdTe, etc., or a quaternary core including, e.g., ZnCdSeS, ZnCdSeTe, ZnCdTeS, etc.

The core 104 may exhibit various colors in accordance with its composition, i.e., a cation content and/or an anion content. Accordingly, the wavelength conversion particle 102 may have various colors of emission light such as blue, red, green, etc.

In example embodiments, the wavelength conversion particle 102 may be a red quantum dot or a yellow quantum dot which absorbs blue light. In this manner, a red color or a yellow color may be transmitted through the transparent substrate S.

The shell 106 may substantially enclose a surface of the core 104, and may include at least one cation and at least one anion. The cation of the shell 106 may include an element in Group XII, e.g., zinc (Zn) and/or cadmium (Cd). The anion of the shell 106 may include an element in Group XVI, e.g., sulfur (S), etc. In example embodiments, the shell 106 may be a binary shell including, e.g., ZnS, or a ternary shell, e.g., ZnCdS.

The ligand 108 may include an organic functional group. The ligand 108 may be provided on the surface of the shell 106 such that the ligand 108 may be chemically bonded to the surface of the shell 106. The organic functional group in the ligand 108 may include, e.g., oleate and/or trioctylphosphine (TOP).

Alternatively, the core 104 may include an element in Group X and/or an element in Group XI. For example, the core 104 may include gold (Au), silver (Ag), and/or platinum (Pt).

When the core 104 includes an element in Group X and/or an element in Group XI, the shell 105 may include silicon oxide. For example, the shell 105 may include silica.

In example embodiments, the wavelength conversion particle 102 may be a blue quantum dot which absorbs a red light or a yellow light of ambient light. In particular, the wavelength conversion particle 102 may be a quantum dot which absorbs visible light of the ambient light having a long wavelength, by surface plasmon absorption.

For example, the wavelength conversion pattern 100 may include a plurality of blue quantum dots only. The ambient light may be transmitted through the transparent substrate S, and the ambient light may be incident on the wavelength conversion pattern 100 including the blue quantum dot. The ambient light may be converted into a blue light, and the blue light may be reflected by the mirror pattern 200. Accordingly, the blue color may be transmitted again through the transparent substrate S such that a blue mirror display is implemented.

The color mirror substrate may include wavelength conversion patterns 102 each including a quantum dot. In the color mirror display device, a mirror property having a desired color may be implemented.

For example, a gold mirror or a black mirror may be implemented by using various types of quantum dots such that a vivid gold color or a vivid black color is recognized by users and a display quality of the color mirror display device is enhanced.

Hereinafter, a method of manufacturing a color mirror substrate may be explained in further detail.

Figure 3:
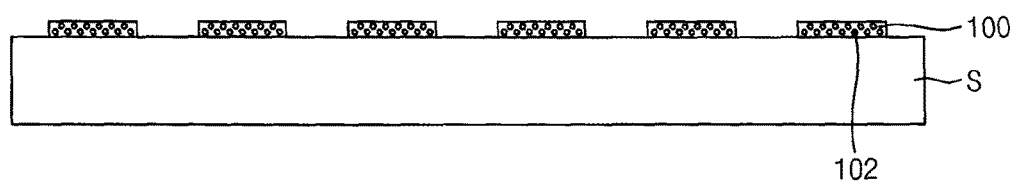
Figure 4:
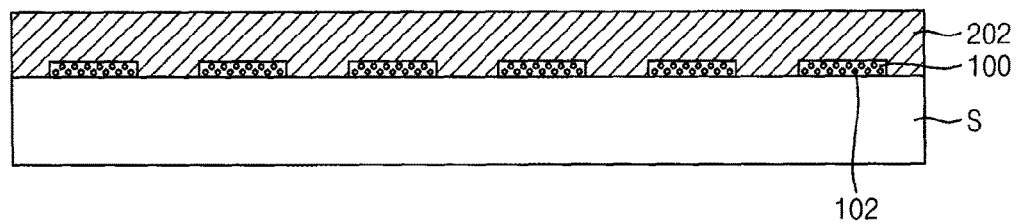
Figure 5:
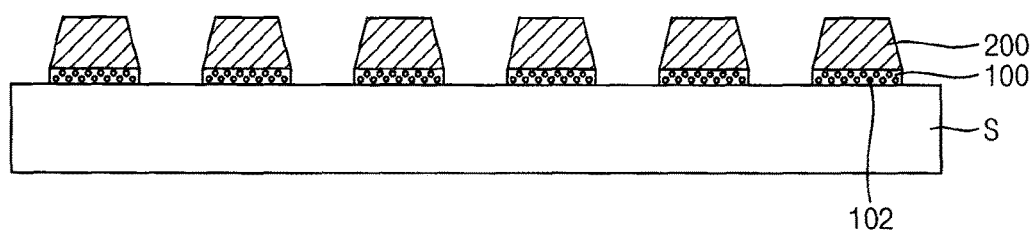

FIGS. 3 to 5 are cross-sectional views illustrating a method of manufacturing a color mirror substrate in accordance with example embodiments.

Referring to FIG. 3, a plurality of wavelength conversion patterns 100 may be formed on a transparent substrate S. Each wavelength conversion pattern 100 may include a wavelength conversion particle 102. As an example, a glass substrate or a transparent plastic substrate may be used as the transparent substrate S.

For example, by using a spin coating process, inkjet printing process, nozzle printing process, spray coating process, slit coating process or dip coating process, a transparent polymer layer (not shown) including a wavelength conversion particle 102 may be formed on the transparent substrate S. The wavelength conversion patterns 100 may then be formed by patterning the transparent polymer layer.

In example embodiments, the transparent polymer layer may include a hole transport layer (HTL) material. The hole transport layer material may include, e.g., polyvinylcarbazole (PVK), N,N'-diphenyl-N,N'-bis(1-naphthylphenyl)-1,1'-biphenyl-4,4'-diamine (NPD), poly-TPD (poly(N,N'-bis (4-butylphenyl)-N—N'-bis(phenyl-benzidine)), poly-TFB (poly [(9,9-dioctylfluorenyl-2,7-diyl)-co-(4,4'-(N-(4-sec-butylphenyl))diphenyl-amine)]), poly(1,4-phenylenevinylene) (PPV), etc.

Referring to FIG. 4, a metal layer 202 may be formed on the wavelength conversion patterns 100 and the transparent substrate S.

The metal layer 202 may be formed of, e.g., Al, Cr, Cu, Ag, Ti, Ta, Mo, W, or the like. These may be used alone or in any combination thereof. The metal layer 105 may be formed by, e.g., a sputtering process, a physical vapor deposition (PVD) process, an atomic layer deposition (ALD) process, a chemical vapor deposition (CVD) process, etc.

Referring to FIG. 5, the metal layer 202 may be patterned by, e.g., a photo-lithography process to form a plurality of mirror patterns 200.

As nonlimiting examples, the mirror patterns 200 may be formed in a grid arrangement, a mesh arrangement or an arrangement including a plurality of islands on the wavelength conversion patterns 100.

Figure 6:
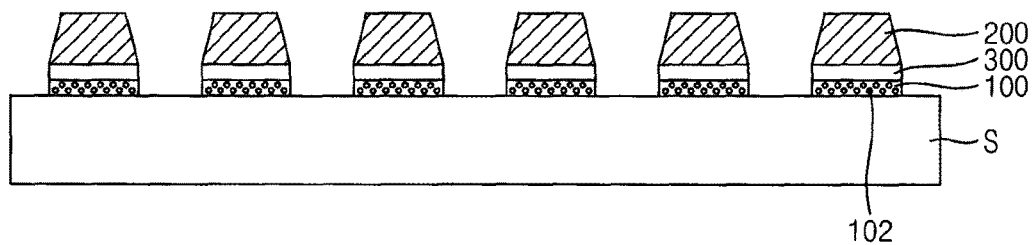

FIG. 6 is a cross-sectional view illustrating a color mirror substrate in accordance with example embodiments.

The color mirror substrate illustrated in FIG. 6 may have structures and/or constructions substantially the same as or similar to those of the display device illustrated in FIGS. 1 and 2 except for an electron transport layer. Thus, detailed descriptions of repeated elements and structures are omitted herein.

Referring to FIG. 6, the color mirror substrate may include a plurality of wavelength conversion patterns 100 arranged on a transparent substrate S, a plurality of electron transport patterns 300 stacked on the wavelength conversion patterns 100, and a plurality of mirror patterns 200 stacked on the electron transport patterns 300. Each wavelength conversion pattern 100 may include a wavelength conversion particle 102.

The transparent substrate S may include, e.g., a glass substrate or a transparent plastic substrate. The transparent substrate S may include a region which overlaps pixel regions of a display device, e.g., when the color mirror substrate is provided as an encapsulation substrate of the display device.

The transparent substrate S may include a region which overlaps a peripheral region surrounding the pixel regions and including a driving circuit of the display device.

The wavelength conversion patterns 100 may be arranged on the transparent substrate S and may have various shapes. For example, the wavelength conversion patterns 100 may be arranged in, e.g., a grid shape, a line shape, a mesh shape, or as a plurality of islands.

The mirror patterns 200 may be arranged over the wavelength conversion patterns 100, respectively. For example, a shape of the mirror patterns 200 may be substantially the same as the shape of the wavelength conversion patterns 100.

Each wave conversion pattern 100 may include the wavelength conversion particle 102. For example, the wavelength conversion particle 102 may include a quantum dot. The quantum dot may include a core 104, a shell 106 enclosing the core 104 and a ligand 108 formed on a surface of the shell 106.

The core 104 may be located at a center of the quantum dot and may have a substantially spherical shape. The core 104 may include at least one cation and at least one anion.

The cation may include an element in Group XII and/or an element in Group XIII. For example, the cation of the core 104 may include cadmium (Cd), zinc (Zn) and/or indium (In).

The anion of the core 104 may include an element in Group XV and/or an element in Group XVI. For example, the anion may include sulfur (S), selenium (Se), tellurium (Te) and/or phosphorous (P).

In example embodiments, the wavelength conversion particle 102 may be a red quantum dot or a yellow quantum dot which absorbs blue light. A red color or a yellow color may thereby be transmitted through the transparent substrate S.

Alternatively, the core 104 may include an element in Group X and/or an element in Group XI. For example, the core 104 may include gold (Au), silver (Ag), and/or platinum (Pt).

When the core 104 includes an element in Group X and/or an element in Group XI, the shell 105 may include silicon oxide. For example, the shell 105 may include silica.

In example embodiments, the wavelength conversion particle 102 may be a blue quantum dot which absorbs a red light or a yellow light. In particular, the wavelength conversion particle 102 may be a quantum dot which absorbs visible light having a long wavelength, by surface plasmon absorption. Accordingly, a blue color may be transmitted and perceived through the transparent substrate 100.

In example embodiments, the color mirror substrate may include the electron transport patterns (ETP) 300 interposed between the wavelength conversion patterns 100 and the mirror patterns 200.

The electron transport patterns 300 may be interposed between the wavelength conversion patterns 100 and the mirror patterns 200, so as to improve an adhesive strength between the wavelength conversion patterns 100 and the mirror patterns 200.

For example, when the mirror patterns 200 include silver (Ag) and the wavelength conversion patterns 100 include a hole transport layer (HTL) material, a mutual adhesion between the wavelength conversion patterns 100 and the mirror patterns 200 may be undesirably low. The electron transport layers 300 may increase the adhesive strength between the wavelength conversion patterns 100 and the mirror patterns 200.

The color mirror substrate may include the wavelength conversion patterns 102 including a quantum dot. In the color mirror display device, a mirror property having a desired color may thus be implemented.

In particular, the electron transport layers 300 may be interposed between the wavelength conversion patterns 100 and the mirror patterns 200 such that the mirror patterns 200 may be formed on the wavelength conversion patterns more easily.

Hereinafter, a method of manufacturing a color mirror substrate may be explained in detail.

Figure 7:
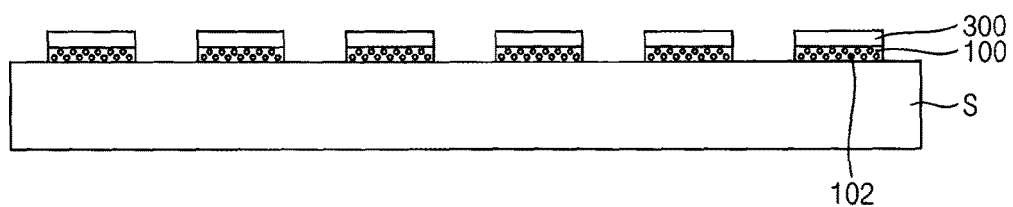
Figure 8:
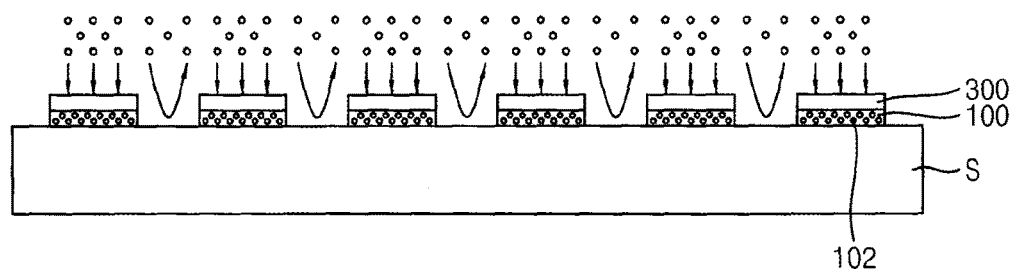

FIGS. 7 and 8 are cross-sectional views illustrating a method of manufacturing a color mirror substrate in accordance with example embodiments. For example, FIGS. 7 and 8 illustrate a method of manufacturing the mirror substrate of FIG. 6. Detailed descriptions of processes and materials substantially the same as or similar to those illustrated with reference to FIGS. 3 to 5 are omitted herein.

Referring to FIG. 7, a plurality of wavelength conversion patterns 100 and a plurality of electron transport patterns 300 may be sequentially formed on a transparent substrate S.

Each wavelength conversion pattern 100 may include a wavelength conversion particle 102. As an example, a glass substrate or a transparent plastic substrate may be used as the transparent substrate S.

For example, by using a spin coating process, inkjet printing process, nozzle printing process, spray coating process, slit coating process or dip coating process, a transparent polymer layer (not shown) including a wavelength conversion particle 102 and an electron transport layer (not shown) may be formed on the transparent substrate S. The wavelength conversion patterns 100 and the electron transport patterns 300 may be formed by patterning the transparent polymer layer and the electron transport layer.

In example embodiments, the transparent polymer layer may include a hole transport layer (HTL) material. The electron transport layer may include an electron transport layer (ETL) material.

The hole transport layer material may include, e.g., polyvinylcarbazole (PVK), N,N'-diphenyl-N,N'-bis(1-naphthylphenyl)-1,1'-biphenyl-4,4'-diamine (NPD), poly-TPD (poly (N,N'-bis(4-butylphenyl)-N—N'-bis(phenyl-benzidine)), poly-TFB (poly [(9,9-dioctylfluorenyl-2,7-diyl)-co-(4,4'-(N-(4-sec-butylphenyl))diphenyl-amine)]), poly(1,4-phenylenevinylene) (PPV), etc.

The electron transport layer material may include a ZnO quantum dot and/or a TiO2 nanoparticle. Alternatively, the electron transport material may include, 2,9-dimethyl-4,7- diphenyl-1,10-phenanhro-line (BCP) and/or 1,3,5-tris(N-phenylbenzimidazol-2,yl)benzene (TPBI).

Referring to FIGS. 8 and 6, by using a metal self-patterning process, a plurality of mirror patterns 200 may be formed on the electron transport patterns 300.

In a metal self-patterning process, a metal material may be deposited on the electron transport patterns 300 without a mask to form the mirror patterns 200. In the metal self-patterning process, the metal material has a weak adhesion to the transparent substrate S but a strong adhesion to the electron transport patterns 300. Accordingly, the mirror patterns 200 may be formed on the electron transport patterns 300 without a mask.

Figure 9:
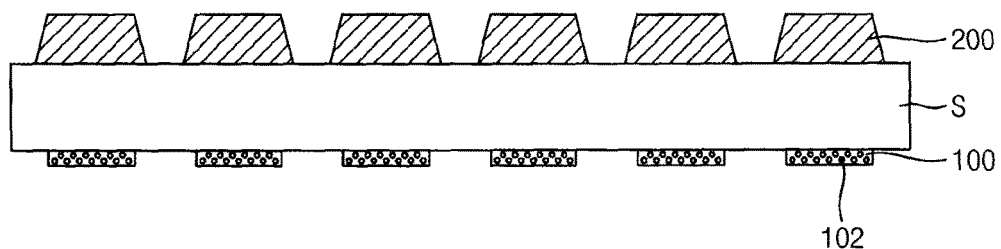

FIG. 9 is a cross-sectional view illustrating a color mirror substrate in accordance with example embodiments.

The color mirror substrate illustrated in FIG. 9 may have structures and/or constructions substantially the same as or similar to those of the display device illustrated in FIGS. 1 and 2, except for an arrangement of a plurality of wave conversion patterns. Thus, detailed descriptions of repeated elements and structures are omitted herein.

Referring to FIG. 9, the color mirror substrate may include a plurality of wavelength conversion patterns 100 arranged at a first surface of a transparent substrate S and a plurality of mirror patterns 200 stacked on a second surface opposite to the first surface of the transparent substrate S. Each wavelength conversion pattern 100 may include a wavelength conversion particle 102.

The transparent substrate S may include, e.g., a glass substrate or a transparent plastic substrate. The transparent substrate S may include a region which overlaps pixel regions of a display device, e.g., when the color mirror substrate is provided as an encapsulation substrate of the display device.

The wavelength conversion patterns 100 may be arranged at the first surface of the transparent substrate S to have various shapes. For example, the wavelength conversion patterns 100 may be arranged in, e.g., a grid shape, a line shape, a mesh shape, or as a plurality of islands.

The mirror patterns 200 may be arranged at the second surface of the transparent substrate S to have various shapes. For example, a shape of the mirror patterns 200 may be substantially same as the shape of the wavelength conversion patterns 100.

Each wave conversion pattern 100 may include one or more wavelength conversion particles 102. For example, each wavelength conversion particle 102 may include a quantum dot. The quantum dot may include a core 104, a shell 106 enclosing the core 104 and a ligand 108 formed on a surface of the shell 106.

The core 104 may be located at a center of the quantum dot and may have a substantially spherical shape. The core 104 may include at least one cation and at least one anion.

The cation may include an element in Group XII and/or an element in Group XIII element. For example, the cation of the core 104 may include cadmium (Cd), zinc (Zn) and/or indium (In).

The anion of the core 104 may include an element in Group XV and/or an element in Group XVI. For example, the anion may include sulfur (S), selenium (Se), tellurium (Te) and/or phosphorous (P).

In example embodiments, the wavelength conversion particle 102 may be a red quantum dot or a yellow quantum dot which absorbs blue light. A red color or a yellow color may thus be transmitted through the transparent substrate S.

Alternatively, the core 104 may include an element in Group X and/or an element in Group XI. For example, the core 104 may include gold (Au), silver (Ag), and/or platinum (Pt).

When the core 104 includes an element in Group X and/or an element in Group XI, the shell 105 may include silicon oxide. For example, the shell 105 may include silica.

In example embodiments, the wavelength conversion particle 102 may be a blue quantum dot which absorbs a red light or a yellow light. In particular, the wavelength conversion particle 102 may be a quantum dot which absorbs visible light having a long wavelength, by surface plasmon absorption. Accordingly, a blue color may be transmitted through the transparent substrate 100.

The color mirror substrate may include the wavelength conversion patterns 102 each including a quantum dot. In the color mirror display device, a mirror property having a desired color may be implemented.

In particular, the wavelength conversion patterns 100 may be located at various positions in the color mirror substrate to enhance a display quality of the color mirror display device.

Figure 10:
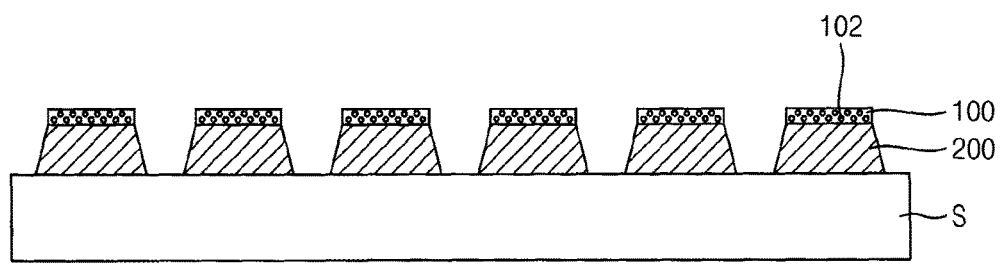

FIG. 10 is a cross-sectional view illustrating a color mirror substrate in accordance with example embodiments.

The color mirror substrate illustrated in FIG. 10 may have structures and/or constructions substantially the same as or similar to those of the display device illustrated in FIG. 9 except for an arrangement of a plurality of wave conversion patterns. Thus, detailed descriptions of repeated elements and structures are omitted herein.

Referring to FIG. 10, the color mirror substrate may include a plurality of mirror patterns 200 arranged on a transparent substrate S, and a plurality of wavelength conversion patterns 100 stacked on the mirror patterns 200. Each wavelength conversion pattern 100 may include a wavelength conversion particle 102.

The transparent substrate S may include, e.g., a glass substrate or a transparent plastic substrate. The transparent substrate S may include a region which overlaps pixel regions of a display device, e.g., when the color mirror substrate is provided as an encapsulation substrate of the display device.

The wavelength conversion patterns 100 may be stacked on the mirror patterns 200 and may have various shapes. For example, the wavelength conversion patterns 100 may be arranged in, e.g., a grid shape, a line shape, a mesh shape, or as a plurality of islands.

The mirror patterns 200 may be arranged on the transparent substrate S to have various shapes. For example, a shape of the mirror patterns 200 may be substantially the same as the shape of the wavelength conversion patterns 100.

Each wave conversion pattern 100 may include wavelength conversion particles 102. For example, each wavelength conversion particle 102 may include a quantum dot. The quantum dot may include a core 104, a shell 106 enclosing the core 104 and a ligand 108 formed on a surface of the shell 106.

The core 104 may be located at a center of the quantum dot and may have a substantially spherical shape. The core 104 may include at least one cation and at least one anion.

The cation may include an element in Group XII and/or an element in Group XIII element. For example, the cation of the core 104 may include cadmium (Cd), zinc (Zn) and/or indium (In).

The anion of the core 104 may include an element in Group XV and/or an element in Group XVI. For example, the anion may include sulfur (S), selenium (Se), tellurium (Te) and/or phosphorous (P).

In example embodiments, the wavelength conversion particle 102 may be a red quantum dot or a yellow quantum dot which absorbs blue light. A red color or a yellow color may thus be perceived through the transparent substrate S.

Alternatively, the core 104 may include an element in Group X and/or an element in Group XI. For example, the core 104 may include gold (Au), silver (Ag), and/or platinum (Pt).

When the core 104 includes an element in Group X and/or an element in Group XI, the shell 105 may include silicon oxide. For example, the shell 105 may include silica.

In example embodiments, the wavelength conversion particle 102 may be a blue quantum dot which absorbs a red light or a yellow light. In particular, the wavelength conversion particle 102 may be a quantum dot which absorbs visible light having a long wavelength, by surface plasmon absorption. Accordingly, a blue color may be perceived through the transparent substrate 100.

The color mirror substrate may include wavelength conversion patterns 102 each including a quantum dot. In the color mirror display device, a mirror property having a desired color may be implemented.

In particular, the wavelength conversion patterns 100 may be located at various positions in the color mirror substrate to enhance a display quality of the color mirror display device.

In some example embodiments, the color mirror substrate may be provided as a thin film encapsulation (TFE) layer of the display device. The TFE layer may include at least one inorganic layer and at least one organic layer. For example, the TFE layer may be provided by stacking (e.g., sequentially stacking) a first inorganic layer, an organic layer, and a second inorganic layer. However, the invention is not limited thereto, and the TFE layer may be provided by stacking (e.g., sequentially stacking) a first inorganic layer, a first organic layer, a second inorganic layer, a second organic layer and a third inorganic layer.

As will be described with reference to FIGS. 16, 17 and 18, when the color mirror substrate is provided as a TFE layer of the display device, the wavelength conversion patterns 100 and the mirror patterns 200 may be formed at (e.g., formed on or formed in) the TFE layer.

Figure 11:
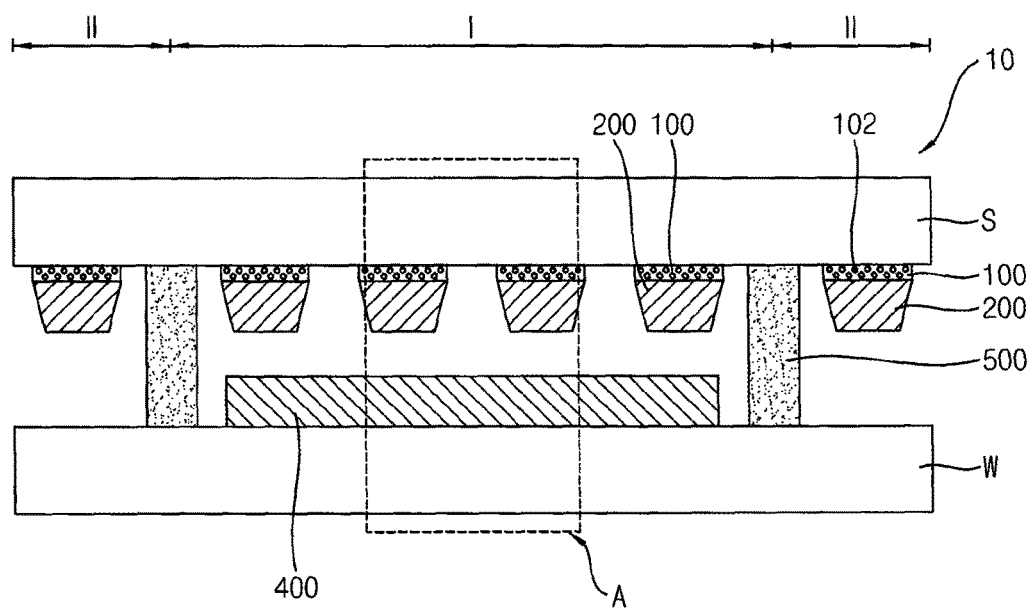
Figure 12:
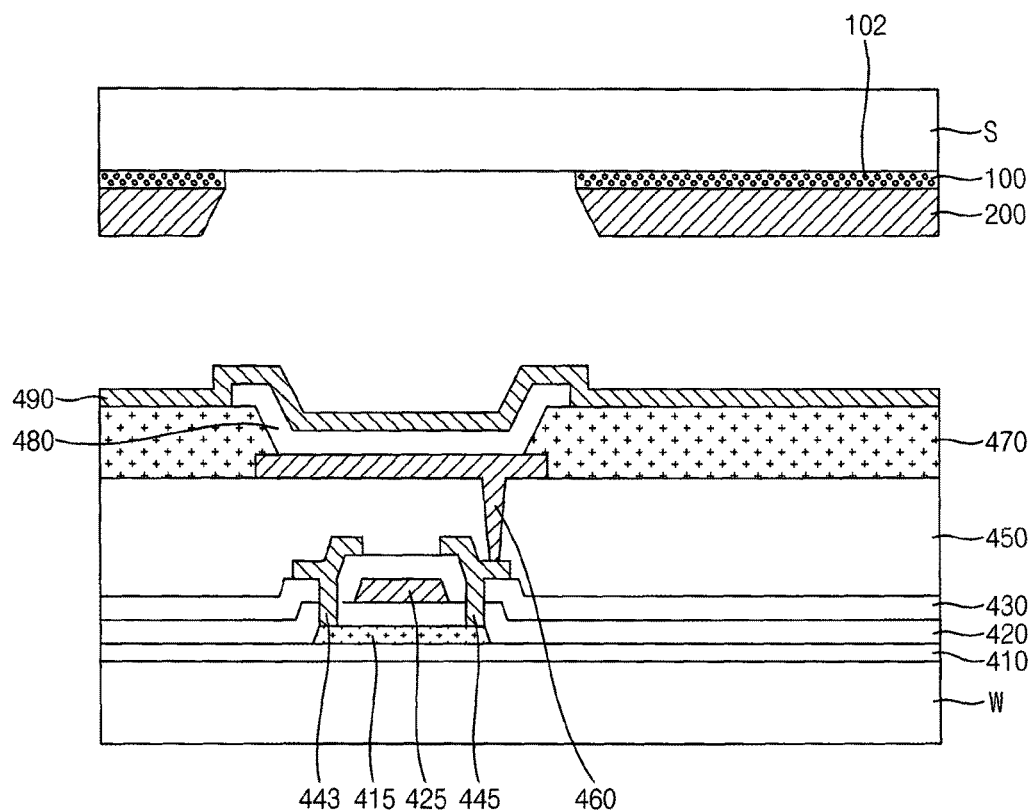

FIG. 11 is a cross-sectional view illustrating a color mirror display device in accordance with example embodiments. FIG. 12 is an enlarged view of a region A of FIG. 11.

Referring to FIGS. 11 and 12, the color mirror display device may include a display unit 400 disposed on a first substrate W, and a color mirror substrate 10 disposed on (e.g., facing) the first substrate W and the display unit 400.

In example embodiments, the color mirror substrate 10 may have structures and/or constructions substantially the same as or similar to those illustrated with reference to FIG. 1. More specifically, the color mirror substrate 10 may be the color mirror substrate of FIG. 1 arranged upside down. The color mirror substrate 10 may be divided into a first region I and a second region II.

As described above, the color mirror substrate 10 may include a plurality of wave conversion patterns 100 under the second substrate S and a plurality of mirror patterns 200 stacked under the wave conversion patterns 100. Each wavelength conversion pattern 100 may include a wavelength conversion particle 102.

A sealing member 500 may be interposed between the first substrate W and the second substrate S such that the display unit 400 may be encapsulated. Thus, the color mirror substrate 10 may substantially serve as an encapsulation substrate.

The display unit 400 may overlap the first region I of the color mirror substrate 10, and a peripheral circuit such as a driving circuit (e.g. a scan driver, an emission control driver, etc.) may be disposed on a portion of the first substrate W overlapping the second region II.

The display unit 400 may include a switching device on the first substrate W, and a display structure electrically connected to the switching device.

The switching device may include, e.g., a thin film transistor (TFT) including an active pattern 415, a gate insulation layer 420, a gate electrode 425, a source electrode 443 and a drain electrode 445. The display structure may include, e.g., a first electrode 460, a display layer 480 and the second electrode 490.

The first substrate W may include, e.g., a glass substrate, a transparent plastic substrate or a flexible plastic substrate.

A barrier layer 410 may be formed on an upper surface of the first substrate W. Moisture penetrating through the first substrate W may be blocked by the barrier layer 410, and impurity diffusion between the first substrate W and structures thereon may also be blocked by the barrier layer 410.

For example, the barrier layer 410 may include silicon oxide, silicon nitride, or silicon oxynitride. These may be used alone or in a combination thereof. In an embodiment, the barrier layer 410 may have a multi-layer structure including a silicon oxide layer and a silicon nitride layer.

The active pattern 415 may include a silicon compound such as polysilicon. In some embodiments, the active pattern 415 may include an oxide semiconductor such as indium gallium zinc oxide (IGZO), zinc tin oxide (ZTO), or indium tin zinc oxide (ITZO). For example, an active layer including the silicon compound or the oxide semiconductor may be formed by a sputtering process, and then may be patterned by a photo-lithography process.

The gate insulation layer 420 may be formed on the barrier layer 410, and cover the active pattern 415. The gate insulation layer 420 may include silicon oxide, silicon nitride and/or silicon oxynitride. The gate insulation layer 420 may have a multi-layer structure including a silicon oxide layer and a silicon nitride layer.

The gate electrode 425 may be formed on the gate insulation layer 420, and may be superimposed over the active pattern 415. For example, a first conductive layer may be formed on the gate insulation layer 420, and may be patterned by a photo-lithography process to form the gate electrode 425. The first conductive layer may be formed of a metal such as Al, Ag, W, Cu, Mo, Ti, Ta, Cr, etc., or a nitride thereof, by a sputtering process or an ALD process. The first conductive layer may be formed as a multi-layer structure such as an Al/Mo structure or a Ti/Cu structure.

In some embodiments, a scan line may be also formed from the first conductive layer. The gate electrode 425 may extend from the scan line.

In some embodiments, an ion-implantation process may be performed using the gate electrode 425 as an implantation mask, such that a source region and a drain region may be formed at both ends of the active pattern 415. A portion of the active pattern 415 between the source and drain regions, which may overlap the gate electrode 425, may be defined as a channel region through which a charge may be moved or transferred.

An insulating interlayer 430 may be formed on the gate insulation layer 420, and may cover the gate electrode 425. The insulating interlayer 430 may include silicon oxide, silicon nitride and/or silicon oxynitride. The insulating interlayer 430 may have a multi-layer structure including a silicon oxide layer and a silicon nitride layer.

The source electrode 443 and the drain electrode 445 may extend through the insulating interlayer 430 and the gate insulation layer 420 to be in contact with the active pattern 415. The source electrode 443 and the drain electrode 445 may be in contact with the source region and the drain region, respectively, of the active pattern 415.

For example, the insulating interlayer 430 and the gate insulation layer 420 may be partially etched to form contact holes through which the active pattern 415 may be exposed. A second conductive layer filling the contact holes may be formed on the insulating interlayer 430, and this conductive layer may be patterned by a photo-lithography process to form the source electrode 443 and the drain electrode 445. The second conductive layer may be formed from a material and a process substantially the same as or similar to those for the first conductive layer.

In some embodiments, a data line may be also formed from the second conductive layer. In this case, the source electrode 443 may extend from the data line.

The TFT may be formed in each pixel of the display unit by the processes as described above. In some embodiments, at least two TFTs and a capacitor may be formed in the each pixel, although any pixel configuration is contemplated.

A via insulation layer 450 may be formed on the insulating interlayer 430, and may cover the source and drain electrodes 443 and 445. The via insulation layer 450 may be formed using an organic material such as polyimide, an epoxy resin, an acrylate-based resin, or polyester, and may be formed by a spin coating process or a slit coating process. The via insulation layer 450 may also serve as a planarization layer of the display unit 400.

The display structure may be formed on the via insulation layer 450.

The first electrode 460 may extend through the via insulation layer 450, and may be electrically connected to the drain electrode 445. For example, the via insulation layer 450 may be partially etched to form a via hole through which the drain electrode 445 may be exposed. A third conductive layer sufficiently filling the via hole may be formed on the via insulation layer, and may be patterned by a photo-lithography process to form the first electrode 460.

The first electrode 460 may serve as an anode or a pixel electrode of the display unit 400, and may be formed in each pixel included in the display unit 300.

The third conductive layer may be formed from a material and a process substantially the same as or similar to those for the first conductive layer. In some embodiments, the third conductive layer may be formed of a transparent conductive layer such as indium tin oxide (ITO), indium zinc oxide (IZO), zinc oxide, indium oxide, etc.

A pixel defining layer (PDL) 470 may be formed on the via insulation layer 450 to cover a peripheral portion of the first electrode 460. For example, the PDL 470 may be formed using a photosensitive organic material, by exposure and developing processes. Alternatively, the PDL 470 may be formed of a silicon-based inorganic material by a photo-lithography process.

In example embodiments, an area of the first electrode 460 exposed by the PDL 470 may substantially correspond to an emitting region of each pixel.

The display layer 480 may be formed on the first electrode 460 and the PDL 470. In example embodiments, the display layer 480 may include an organic light emitting material, and the display device may thus be an OLED device. In this case, a hole transport layer (HTL) and an electron transport layer (ETL) may be further formed under the display layer 480 and on the display layer 480, respectively.

The display layer 480 may be formed by individually printing the organic light emitting material on each pixel. The HTL and the ETL may be formed in each pixel, or may be formed commonly along a plurality of the pixels.

In some embodiments, a liquid crystal material may be used for the display layer 480. In this case, the display device may be provided as an LCD device.

The second electrode 490 may be formed on the PDL 470 and the display layer 480. In some embodiments, the second electrode 490 may serve as a common electrode formed on the plurality of the pixels. The second electrode 490 may also serve as a cathode of the display unit 400.

The second electrode 490 may be formed by a depositing a metal or a transparent conductive material as mentioned above through, e.g., an open mask.

A portion of the transparent substrate S between neighboring mirror patterns 200 may substantially overlap the emitting region of the display unit 400. A non-emitting region of the display unit 400 may overlap a stacked structure including the wavelength conversion patterns 100 and the mirror pattern 200 of the color mirror substrate 10. Therefore, a mirror property may be realized over the non-emitting region.

As described above with reference to FIG. 1, the wave conversion patterns 100 may be interposed between the mirror patterns 200 and the second substrate S such that a color mirror property having a desired color is implemented.

Figure 13:
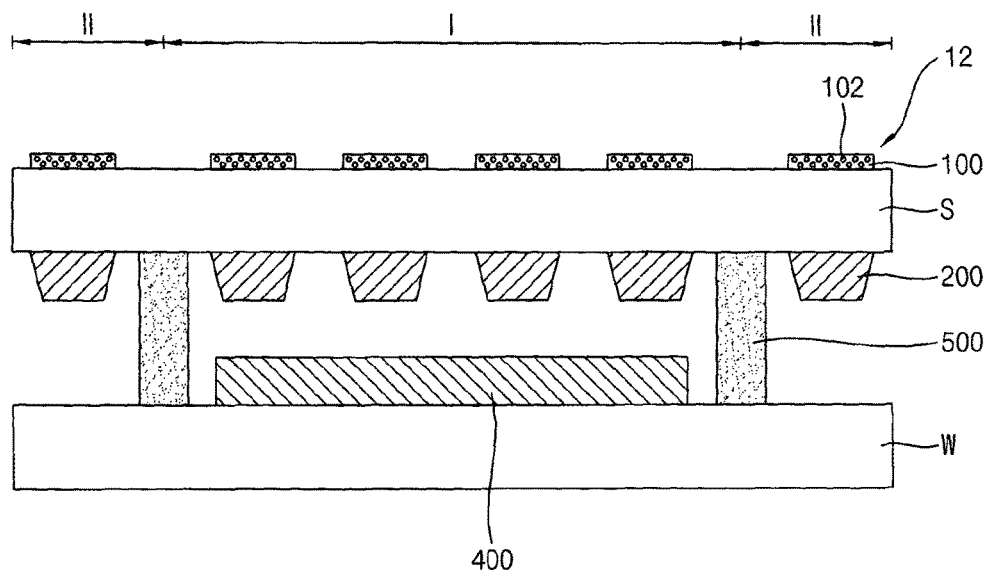

FIG. 13 is a cross-sectional view illustrating a color mirror display device in accordance with example embodiments.

The color mirror display device illustrated in FIG. 13 may have structures and/or constructions substantially the same as or similar to those of the color mirror display device illustrated in FIG. 12 except for an arrangement of a plurality of wave conversion patterns. Thus, detailed descriptions of repeated elements and structures are omitted herein.

Referring to FIG. 13, the color mirror display device may include a display unit 400 disposed on a first substrate W, and a color mirror substrate 12 disposed on (e.g., facing) the first substrate W and display unit 400.

In example embodiments, the color mirror substrate 12 may have structures and/or constructions substantially the same as or similar to those illustrated with reference to FIG. 9. In particular, the color mirror substrate 12 may be the color mirror substrate of FIG. 9 arranged upside down. The color mirror substrate 12 may be divided into a first region I and a second region II.

As described above, the color mirror substrate 12 may include a plurality of wave conversion patterns 100 disposed at a first surface of a second substrate S, and a plurality of mirror patterns 200 and a plurality of mirror patterns 200 disposed at a second surface of the second substrate S opposite to the first surface.

A sealing member 500 may be interposed between the first substrate W and the second substrate S such that the display unit 400 may be encapsulated. Thus, the color mirror substrate 12 may substantially serve as an encapsulation substrate.

The display unit 400 may overlap the first region I of the color mirror substrate 12, and a peripheral circuit such as a driving circuit may be disposed on a portion of the first substrate W overlapping the second region II.

The display unit 400 may include a switching device on the first substrate W, and a display structure electrically connected to the switching device.

The switching device may include, e.g., a thin film transistor (TFT) including an active pattern 415, a gate insulation layer 420, a gate electrode 425, a source electrode 443 and a drain electrode 445. The display structure may include, e.g., a first electrode 460, a display layer 480 and the second electrode 490.

A portion of the transparent substrate S between neighboring mirror patterns 200 may substantially overlap the emitting region of the display unit 400. A non-emitting region of the display unit 400 may overlap a stacked structure including the wavelength conversion patterns 100 and the mirror pattern 200 of the color mirror substrate 12. Therefore, a mirror property may be realized over the non-emitting region.

As described above with reference to FIG. 9, the wave conversion patterns 100 may be disposed on the first surface of the second substrate S such that a color mirror property having a desired color is implemented.

Figure 14:
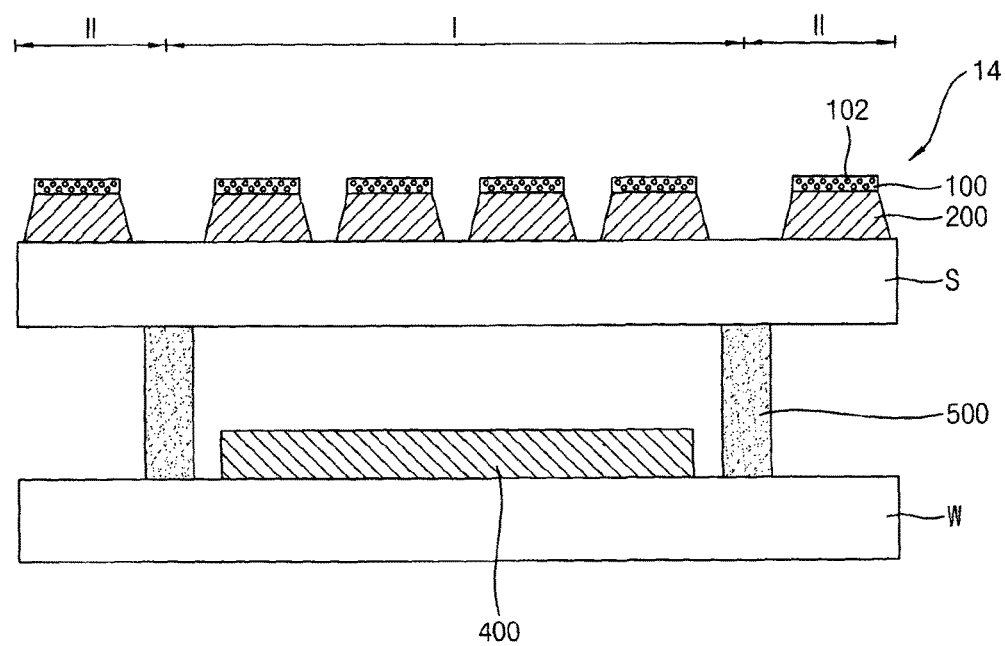

FIG. 14 is a cross-sectional view illustrating a color mirror display device in accordance with example embodiments.

The color mirror display device illustrated in FIG. 14 may have structures and/or constructions substantially the same as or similar to those of the color mirror display device illustrated in FIG. 13, except for an arrangement of a plurality of mirror patterns. Thus, detailed descriptions of repeated elements and structures are omitted herein.

Referring to FIG. 14, the color mirror display device may include a display unit 400 disposed on a first substrate W, and a color mirror substrate 14 disposed on (e.g., facing) the first substrate W and display unit 400.

In example embodiments, the color mirror substrate 14 may have structures and/or constructions substantially the same as or similar to those illustrated with reference to FIG. 10. More specifically, the color mirror substrate 14 may be the color mirror substrate of FIG. 10 arranged upside down. The color mirror substrate 14 may be divided into a first region I and a second region II.

As described above, the color mirror substrate 14 may include a plurality of mirror patterns 200 on a second substrate S and a plurality of wavelength conversion patterns 100 on the mirror patterns 200. Each wavelength conversion pattern may include a wavelength conversion particle 102.

A sealing member 500 may be interposed between the first substrate W and the second substrate S such that the display unit 400 may be encapsulated. Thus, the color mirror substrate 14 may substantially serve as an encapsulation substrate.

The display unit 400 may overlap the first region I of the color mirror substrate 14, and a peripheral circuit such as a driving circuit may be disposed on a portion of the first substrate W overlapping the second region II.

The display unit 400 may include a switching device on the first substrate W, and a display structure electrically connected to the switching device.

The switching device may include, e.g., a thin film transistor (TFT) including an active pattern 415, a gate insulation layer 420, a gate electrode 425, a source electrode 443 and a drain electrode 445. The display structure may include, e.g., a first electrode 460, a display layer 480 and the second electrode 490.

A portion of the transparent substrate S between neighboring mirror patterns 200 may substantially overlap the emitting region of the display unit 400. Non-emitting regions of the display unit 400 may overlap the wavelength conversion patterns 100 and the mirror patterns 200 of the color mirror substrate 14. Therefore, a mirror property may be realized over the non-emitting regions.

As described above with reference to FIG. 10, the wave conversion patterns 100 may be disposed on the mirror patterns 200 such that a color mirror property having a desired color is implemented.

Figure 15:
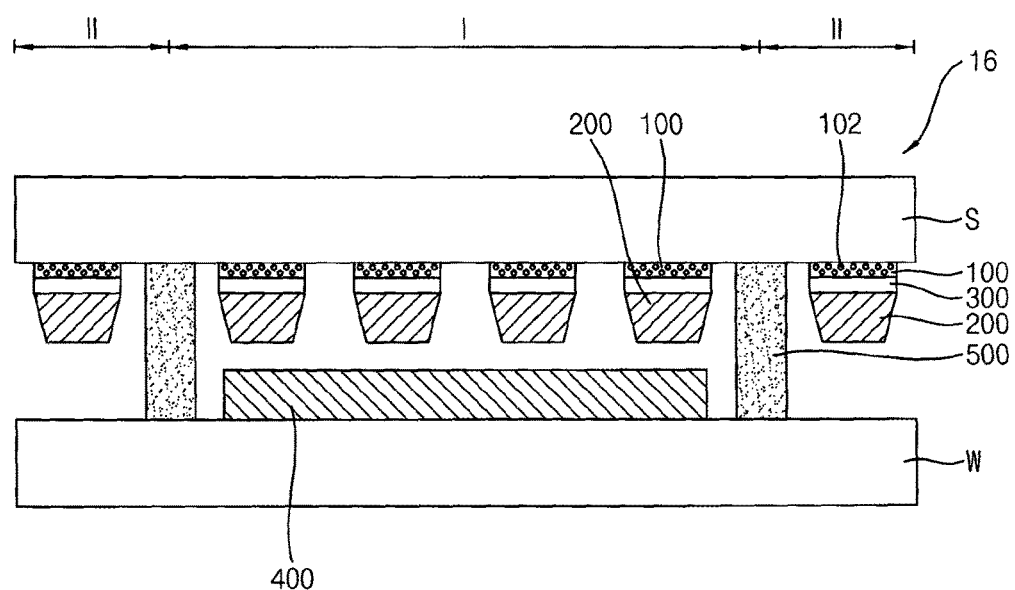

FIG. 15 is a cross-sectional view illustrating a color mirror display device in accordance with example embodiments.

The color mirror display device illustrated in FIG. 15 may have structures and/or constructions substantially the same as or similar to those of the color mirror display device illustrated in FIG. 11, except for a plurality of electron transport patterns. Thus, detailed descriptions of repeated elements and structures are omitted herein.

Referring to FIG. 15, the color mirror display device may include a display unit 400 disposed on a first substrate W, and a color mirror substrate 16 disposed on (e.g., facing) the first substrate W with respect to the display unit 400.

In example embodiments, the color mirror substrate 16 may have structures and/or constructions substantially the same as or similar to those illustrated with reference to FIG. 6. The color mirror substrate 16 may be the color mirror substrate of FIG. 6 arranged upside down, for example. The color mirror substrate 16 may be divided into a first region I and a second region II.

As described above, the color mirror substrate 16 may include a plurality of wavelength conversion patterns 100 disposed under a second substrate S, a plurality of electron transport patterns 300 disposed under the wavelength conversion patterns 100, and a plurality of mirror patterns 200 disposed under the electron transport patterns 300.

A sealing member 500 may be interposed between the first substrate W and the second substrate S such that the display unit 400 may be encapsulated. Thus, the color mirror substrate 16 may substantially serve as an encapsulation substrate.

The display unit 400 may overlap the first region I of the color mirror substrate 16, and a peripheral circuit such as a driving circuit may be disposed on a portion of the first substrate W overlapping the second region II.

The display unit 400 may include a switching device on the first substrate W, and a display structure electrically connected to the switching device.

The switching device may include, e.g., a thin film transistor (TFT) including an active pattern 415, a gate insulation layer 420, a gate electrode 425, a source electrode 443 and a drain electrode 445. The display structure may include, e.g., a first electrode 460, a display layer 480 and the second electrode 490.

A portion of the transparent substrate S between neighboring mirror patterns 200 may substantially overlap the emitting region of the display unit 400. A non-emitting region of the display unit 400 may overlap the wavelength conversion patterns 100 and the mirror pattern 200 of the color mirror substrate 16. Therefore, a mirror property may be realized over the non-emitting region.

As described above with reference to FIG. 6, the wave conversion patterns 100 may be disposed under the second substrate S such that a color mirror property having a desired color is implemented.

In particular, the electron transport patterns 300 may be interposed between the mirror patterns 200 and the wavelength conversion patterns 100 such that the mirror patterns 200 may better adhere to the wavelength conversion patterns 100.

Figure 16:
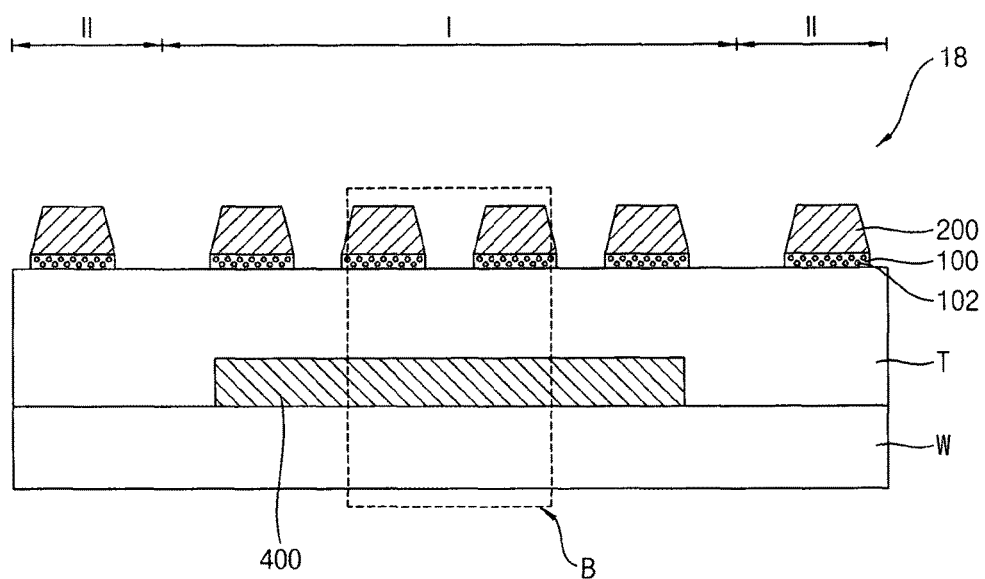
FIG. 16 is a cross-sectional view illustrating a color mirror display device in accordance with example embodiments.

FIG. 16 is a cross-sectional view illustrating a color mirror display device in accordance with example embodiments. FIGS. 17 and 18 are enlarged views of a region B of FIG. 16.

Figure 17:
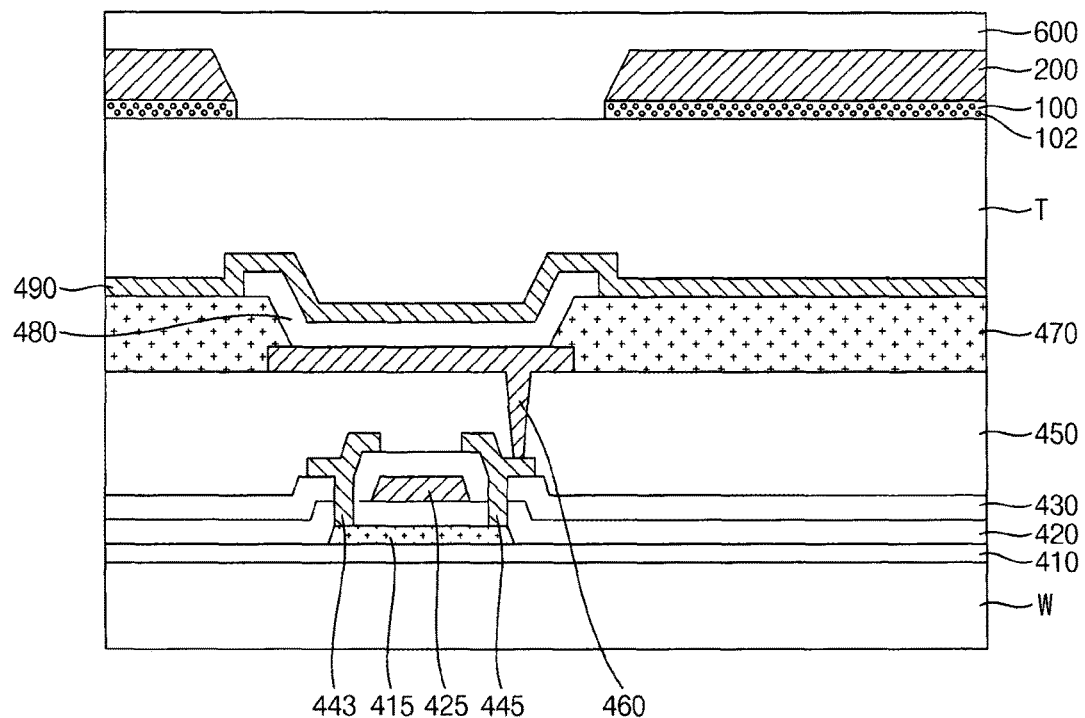
FIGS. 17 and 18 are enlarged views of a region B of FIG. 16.
Figure 18:
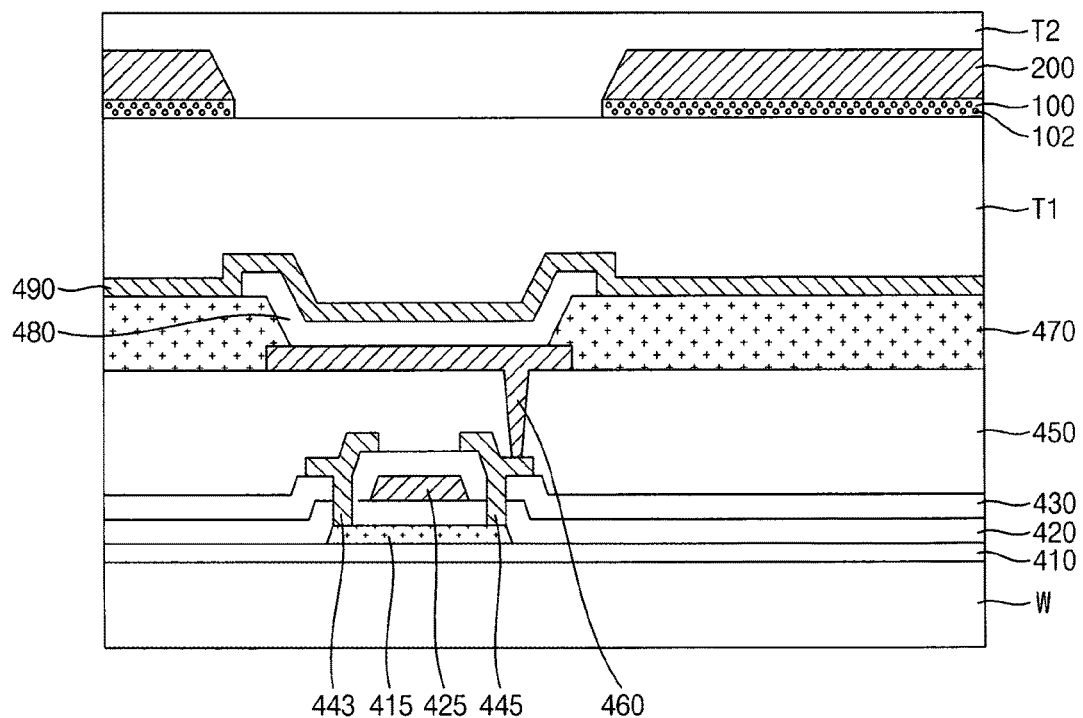

Referring to FIGS. 16, 17 and 18, the color mirror display device may include a display unit 400 disposed on a first substrate W, and a color mirror substrate 18 disposed on the first substrate W and the display unit 400.

The color mirror display device of FIGS. 16, 17 and 18 may be substantially the same as the color mirror display device of FIGS. 11 and 12, except that a second substrate T (e.g., a color mirror substrate) included in the color mirror substrate 18 is substantially provided as a TFE layer, and then a sealing member is omitted. For example, the TFE layer T may include a first inorganic layer, an organic layer, and a second inorganic layer that are sequentially stacked. However, the TFE layer T is not limited thereto.

In an example embodiment, as illustrated in FIG. 17, the wavelength conversion patterns 100 and the mirror patterns 200 may be formed on the TFE layer T. For example, the wavelength conversion patterns 100 may be arranged on the TFE layer T (e.g., on a top inorganic layer of the TFE layer T), and the mirror patterns 200 may be stacked on the wavelength conversion patterns 100. An insulation layer 600 may be further formed on the TFE layer T on which the wavelength conversion patterns 100 and the mirror patterns 200 are stacked.

In another example embodiment, the wavelength conversion patterns 100 and the mirror patterns 200 may be formed in the TFE layer T. For example, as illustrated in FIG. 18, the TFE layer T may include a first TFE layer T1 and a second TFE layer T2, and the wavelength conversion patterns 100 and the mirror patterns 200 may be interposed between the first TFE layer T1 and the second TFE layer T2. In other words, The wavelength conversion patterns 100 may be arranged on the first TFE layer T1, the mirror patterns 200 may be stacked on the wavelength conversion patterns 100, and the second TFE layer T2 may be formed on the first TFE layer T1 on which the wavelength conversion patterns 100 and the mirror patterns 200 are stacked. For example, the first TFE layer T1 may include a first inorganic layer and an organic layer, and the second TFE layer T2 may include a second inorganic layer. For another example, the first TFE layer T1 may include a first inorganic layer, and the second TFE layer T2 may include an organic layer and a second inorganic layer. However, the first and second TFE layers T1 and T2 are not limited thereto.

Although not illustrated in FIGS. 17 and 18, the color mirror substrate 18 in FIG. 16 may have structures and/or constructions similar to those illustrated with reference to FIGS. 6, 9 and 10.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims. Various features of the above described and other embodiments can be mixed and matched in any manner, to produce further embodiments consistent with the invention.

What is claimed is:

1. A color mirror display device comprising:
a display unit on a first substrate; and
a color mirror substrate on the first substrate and the display unit, the color mirror substrate including:
a plurality of wavelength conversion patterns arranged on a second substrate, each wavelength conversion pattern including a wavelength conversion particle, wherein the plurality of wavelength conversion patterns including a plurality of openings exposing a plurality of light emitting regions of the display unit; and
a plurality of mirror patterns, ones of the mirror patterns overlapping centers of respective ones of the wavelength conversion patterns.

2. The color mirror display device of claim 1:
wherein the wavelength conversion particle includes a quantum dot; and
wherein the quantum dot includes a core, a shell enclosing the core and a ligand formed on a surface of the shell.

3. The color mirror display device of claim 2:
wherein the core includes at least one cation and at least one anion;
wherein the cation is selected from a group consisting of an element in Group XII and an element in Group XIII; and
wherein the anion is selected from a group consisting of an element in Group XV and an element in Group XVI.

4. The color mirror display device of claim 3:
wherein the shell includes at least one cation and at least one anion;
wherein the cation is an element in Group XII; and
wherein the anion is an element in Group XVI.

5. The color mirror display device of claim 4, wherein the ligand includes oleate or trioctylphosphine.

6. The color mirror display device of claim 2, wherein the core includes at least one element which is selected from a group consisting of an element in Group X and an element in Group XI.

7. The color mirror display device of claim 6, wherein the core includes gold, silver or platinum.

8. The color mirror display device of claim 6, wherein the shell includes silicon oxide.

9. The color mirror display device of claim 1:
wherein the display unit includes a plurality of pixels each of which includes an emissive region and a non-emissive region;
wherein the emissive region overlaps a portion of the second substrate between neighboring ones of the wavelength conversion patterns; and
wherein the non-emissive region overlaps a stacked structure including the wavelength conversion patterns and the mirror patterns.

10. The color mirror display device of claim 9, wherein the emissive region includes an organic emitting layer or a liquid crystal layer.

11. The color mirror display device of claim 1:
   wherein the wavelength conversion patterns are arranged under the second substrate; and
   wherein the mirror patterns are stacked under the wavelength conversion patterns.

12. The color mirror display device of claim 11, further comprising:
   a plurality of electron transport patterns (ETPs) interposed between the wavelength conversion patterns and the mirror patterns.

13. The color mirror display device of claim 1:
   wherein the second substrate includes a thin film encapsulation layer;
   wherein the wavelength conversion patterns are arranged on the second substrate; and
   wherein the mirror patterns are stacked on the wavelength conversion patterns.

14. The color mirror display device of claim 13, further comprising:
   an insulation layer disposed on the second substrate on which the wavelength conversion patterns and the mirror patterns are stacked.

15. The color mirror display device of claim 1:
   wherein the second substrate includes a first thin film encapsulation layer and a second thin film encapsulation layer;
   wherein the wavelength conversion patterns are arranged on the first thin film encapsulation layer;
   wherein the mirror patterns are stacked on the wavelength conversion patterns; and
   wherein the second thin film encapsulation layer is disposed on the first thin film encapsulation layer on which the wavelength conversion patterns and the mirror patterns are stacked.

* * * * *